Aug. 8, 1967 H. S. MAKOWSKI ETAL 3,335,050

PLASTIC BONDED COPPER FOIL AND PROCESS OF PRODUCING SAME

Filed Jan. 22, 1962

HENRY S. MAKOWSKI
JAMES R. MICHAEL
WILLIAM H. SMYERS
Inventors

By Ernest V. Haines
Patent Attorney

United States Patent Office 3,335,050

Patented Aug. 8, 1967

3,335,050

PLASTIC BONDED COPPER FOIL AND PROCESS OF PRODUCING SAME

Henry S. Makowski, Carteret, James R. Michael, Roselle, and William H. Smyers, Westfield, N.J., assignors to Esso Research and Engineering Company, a corporation of Delaware Filed Jan. 22, 1962, Ser. No. 167,962
24 Claims. (Cl. 161—217)

The present invention relates to plastic bonded copper foils and the process of producing same. More particularly, the invention is concerned with the production of copper foils bonded to poly mono olefins which in turn are bonded to reinforced plastic sheets or panels and more particularly is concerned with the production of copper foil strongly bonded to such articles, the articles being principally employed in printed circuitry in television and radio manufacture and for use in connection with the fabrication and production of electronic devices employing printed circuit components, such as computing machines, etc.

Various patents have been issued in which copper foil has been bonded with the aid of thermosetting resins in the production of printed circuits, for example, Steigerwalt, U.S. Patent 2,716,268, Foord, U.S. Patent 2,551,591 and Gillett et al., U.S. Patent 2,965,952 are concerned with the production of printed circuitry for purposes identical with or similar to the purposes for which the articles manufactured under the instant invention are concerned. The principal problem involved is to find a material which can be bonded to the copper foil sufficiently tightly so as to insure against, or at least to minimize, any possibility that the copper foil will become loosened and be separated from the surface to which it is attached and to use a material which itself has a high dielectric property so that current leakage is minimized as between the adhered layer and its base with reference to the copper foil bonded thereto. One method as illustrated by Foord, supra, is to bond a copper oxide coated copper foil to a polyethylene which then in turn can be bonded to a stronger laminated reinforced resinous panel, while insuring that the copper foil remains firmly bonded to the polyethylene, and while at the same time presenting a continuous strip of copper foil for use in the circuitry.

It has now been discovered that an excellent bond between a copper oxide coated copper foil and a poly mono olefin can be realized through the expedient of blending or compounding a minor amount, i.e. less than 50% by weight of an unvulcanized rubber, either natural or synthetic, into the poly mono olefin prior to contacting the copper oxide surface of the copper foil with the poly mono olefin. In this manner unexpectedly high adhesive strength is attained, while at the same time the other surface of the sheet or film of such a poly mono olefin can be readily bonded to a laminate containing reinforc- of a resinifiable mix which ultimately can be cured, usual- of a resinfiable mix which ultimately can be cured, usually by heating, with the aid of peroxides to a thermoset resinous composition.

The accompanying drawing presents in diagrammatic sectional elevation of two examples of products produced by the instant invention.

Figure 1:
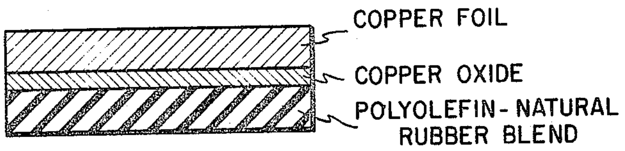
FIG. 1 represents a laminate of a copper foil, having a copper oxide coating thereon, bonded, by the oxide coating, to a blend of a poly mono olefin-unvulcanized natural rubber layer.
Figure 2:
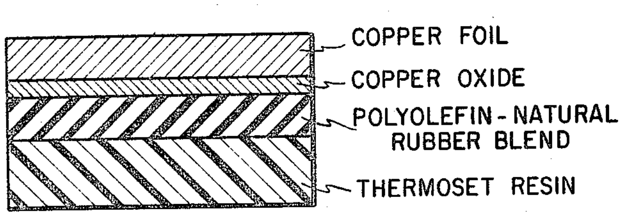
FIG. 2 represents, in schematic outline, the same laminations, as represented in FIG. 1 except that the polyolefin-natural rubber blend is bonded to a thermoset resin which can contain reinforcing elements.

The copper foil employed in connection with the present invention has one side of it treated to completely coat it with a copper oxide coating. One method by which this can be accomplished, although any desirable and convenient method of oxidizing metallic copper surfaces can be employed, is to employ the following procedure. The copper foil of 1–2 mils in thickness is cleaned by treating it with an acid mixture of the following proportions (all parts being by weight): Water, 64 parts; sulfuric acid (95%), 64 parts; nitric acid (70%), 32 parts; hydrochloric acid (38%), 1 part. After etching the surface with this mixture, the surface is rinsed, preferably with distilled water, the cleaned copper foil is then placed in a solution of Ebanol C (Enthone, Inc.), using 1.5 lbs. per gal. of water for 20 minutes at 100° C. (U.S. Patents 2,364,993; 2,460,896; 2,460,898; and 2,481,854.) After this treatment the oxidized copper foil is rinsed in water and dried to give a black coating of copper oxide on the foil. As pointed out by the Foord patent supra, a lesser degree of copper oxide formation on the cleaned copper foil can also be achieved by heating it in an atmosphere containing free oxygen, the temperature and length of the heating determining to a large extent the degree of oxidation attained. This can be judged by a rule of thumb (as pointed out by Foord) by the color of the oxide coating ranging from bright ruby to bright yellowish-red, matt pink, matt brownish black, and finally black. So long as the copper foil contains a thorough uniform copper oxide coating it will, according to the process of the present invention, be firmly bonded to the polyolefin-unvulcanized rubber composition and will have a high bonding strength as determined by the conventional peel strength test procedure to be hereinafter more fully described.

The poly mono olefin-unvulcanized rubber blend composition is prepared using either high or low density poly mono olefins having either amorphous, crystalline, or both, properties. High density crystalline polymers are preferred. Principally, poly mono olefins such as polyethylene, polypropylene, blended mixtures of the two, copolymers of ethylene-propylene or of ethylene-butenes are employed in preparing compounded compositions which are pressed or rolled into sheets or films for use in preparing the copper foil bonded articles of the present invention. In general, the melt index of the poly mono olefin will be between about 0.001 and about 12 as measured by the standard ASTM method No. D–1238–57T. The density of the polyethylene or its copolymer should be between about 0.89 and about 0.96 gram per c.c. and of polypropylene between about 0.86 and about 0.91 gram per c.c.

Natural uncured rubber (Hevea) in the form of smoked sheet or pale crepe, for example, is particularly useful in practicing the present invention. Synthetic rubbers which can be employed are of the polydiolefin type and substantially cis in stereo structure such as cis polyisoprene, although synthetic rubbers do not give superior adhesion as compared with the use of natural rubber blends or the unblended poly mono olefins.

The required amounts of the polyolefin and unvulcanized rubber may be compounded in any convenient manner, as, for example, by admixing pellets of the poly mono olefins in the required amount with the required amount of unvulcanized rubber and subjecting it to the action of heated rollers or to compounding in a Banbury mixer. The mixture should be subjected to a temperature, while compounding, of between about 225 and about 500° F., preferably between about 260°and about 400° F., and should continue to be masticated under those temperatures for a sufficient period of time to obtain a uniform mixture, usually between about 5 minutes and about 1 hour, after which the material is sheeted or otherwise rolled into a thin film for use in bonding to the copper oxide coated surface of copper foil sheeting or strips.

The actual bonding of the polyolefin-rubber blend is accomplished generally in one of two ways. A laminate may be prepared in one operation. In this procedure the copper oxide surface is laid up against the polyolefin-unvulcanized rubber sheet or film of 2 to 10 mils thickness or thicker with the copper oxide coated side of the copper foil being adjacent the polyolefin-rubber sheet. Next a resinifiable mix impregated reinforcing element prepreg, or a B-stage cured polydiolefin mix similarly reinforced and in the form of a sheet or strip is layed up against the other side of the polyolefin-unvulcanized rubber sheet, i.e. the side opposite to that contacting the oxide coated copper foil, and the entire multi-layered composition pressed between heated platens or other suitable heatable pressure devices at a pressure of about 25–2500 lbs. per square inch, preferably 100–1500 p.s.i., at a temperature of between about 270° F. and about 400° F. for a sufficient period of time to effect a cure of the prepreg or B-stage cured polydiolefin reinforced laminate employed and to provide the bond between the polyolefin-rubber sheet and the copper foil.

As another modification of the process and one which lends itself particularly to practical commercial operation, the bonding of the polyolefin-unvulcanized rubber blended composition in the form of sheeting or film strips to the copper oxide coated side of the copper foil may be effected by placing the two surfaces in contact with each other and passing these two materials between heated rollers at about 270–400° F., at a pressure of between about 1 and about 100 lbs. per square inch more or less for a period of time ranging between about 0.1 and about 2 minutes. The resultant laminated product may then be cooled and conveniently rolled into suitable sized rolls and packaged for shipment. The fabricator of electronic printed television, radio or computer circuits may then complete the final laminated articles by applying strips or other configurations of the polyolefin-unvulcanized rubber-copper oxide coated copper foil laminate to a prepreg reinforced article, or to a B-stage cured reinforced laminate copolymer. He may then complete the preparation of the final printed circuit component through the application of the above-defined pressures while using the temperatures and times herein stated for completing the cure and production of the finished article.

The reinforced laminated component may be prepared in a number of ways as above indicated, depending upon the particular polymeric materials used for preparing the reinforced laminate component. In one embodiment a resinifiable mix is prepared with a polydiolefin such as polybutadiene per se, or with a copolymer of a diolefin, for example butadiene, and a small percentage of up to 25% by weight of styrene, to produce a polymeric oil, using as a catalyst metallic sodium. The use of such curable polymers using conjugated diolefins of 4 to 6 carbon atoms per molecule, i.e., butadiene, hexadiene, isoprene dimethyl butadiene, piperylene and methyl pentadiene with minor amounts of ethylenically unsaturated monomer, i.e. styrene, acrylonitrile, methyl vinyl ketone or methyl substituted styrenes, produces a polymeric oil which, when activated with suitable curatives, can be impregnated into the reinforcing element or fabric to make a "wet resin lay-up," followed by subjecting it to a B-stage cure using small amounts (1.0 to 6.0 parts by weight based on 100 parts by weight of resin solids) of dicumene peroxide or di-t-butyl peroxide.

In another type of reinforced laminate using the "wet resin lay-up" technique, a preferred procedure is to prepare a mix of about 40 to 80 parts of the above-described polydiolefinic polymer or copolymer oil, and about 60 to 20 parts of monofunctional monomer, e.g. styrene, vinyl toluene, methylmethacrylate, diethyl fumarate, and a minor proportion, e.g. 2–5% of polyfunctional crosslinker, e.g. divinylbenzene (DVB) dialkyl phthalate, ethylene dimethacrylate or trialkyl cyanurate. About 1–6%, preferably 2–5%, of a peroxide catalyst is also added as curative. A reinforcing material, e.g. glass cloth, or paper, etc., is impregnated with such a wet resin mix, placed in a press mold, and heated at a temperature between about 250 and 350° F., preferably 265 to 335° F. under a pressure of from 30 to 200 p.s.i.g. for from 1 minute to 2 hours, using just sufficient time and temperature to give a B-stage or partial cure. Usually 6 minutes at 265° F. is sufficient. Such a cure is not complete but is intended to be intermediate that required for a complete cure.

A completely cured resin can be obtained by varying the temperature inversely with the time, for example, at a low temperature, e.g. 270° F., a long time is required to produce a completely cured resin, e.g. 24 hours. Similarly, at a high temperature of 350° F., a short time, e.g. 60 minutes, is required. However, in this invention, a relatively low temperature and a relatively short time are employed; and, therefore, only a partially cured resinifiable mix is obtained. This partially cured B-stage product is not the same as a completely cured (hard) resin since the chemical and physical properties are inherently different as shown below.

| Physical Properties | B-Stage | Completely Cured |
|---|---|---|
| Hardness, Shore D (5 sec. yield): | | |
| Resin | 2–40 | 80–97 |
| Resin with reinforcing agent, e.g. random glass fibers | 8–60 | 82–98 |
| Extrusion-Parallel Plates at 200 p.s.i., percent | 30–500 | 0–0.5 |
| Mold-ability (qualitative) | (1) | None |
| Thermoplasticity-Hardness: Decrease for 75 to 350° F. range (Shore D units) | 3–25 | 30–45 |
| Flexural strength, p.s.i.$\times 10_3$: Reinforced resin with random glass fibers | 0.1–15 | 18–35 |
| Swelling (weight gain after 2 hrs. exposure to $CCl_4$ at 75° F.), percent | 50–200 | 0.0 |

[1] Good to excellent.

Alternatively, the aforementioned resinifiable polydiolefinic oil can be reacted with a graft monomer, such as styrene or vinyl toluene, to form a graft polymer, by heating at a temperature between 200° and 300° F., preferably 240° and 275° F. for 15 to 5 hours, preferably 30 minutes to 2 hours. The graft polymer is not the same as a B-stage or partially cured resin mix, or a completely cured resin mix. The graft polymer has only two-dimensional cross-linking, whereas the B-stage and final cures have three dimensional cross-linking, slight or extensive respectively. Furthermore, the graft polymer is soluble in hydrocarbon solvents, e.g. toluene, xylene, closecut naphthas, and Varsol; in contrast, the B-stage is not soluble in these compounds. The comparison of properties of the three stages are demonstrated herebelow.

| Graft Polymer | B-Stage | Complete Cure |
|---|---|---|
| Soluble in Solvents. Viscosity between 1 and 50 poise at 50% NVM. | Soft gel, swells in solvents and therefore not soluble in solvents. | Hard solid, affected very slightly by, or inert to, solvents. |

A suitable graft polymer may be prepared by heating a 30–50% solution polybutadiene oil or 80:20 butadiene-styrene copolymer oil in toluene or xylene, as inert solvent, to about 100–125° C., preferably 110° C., and gradually adding a solution of 0.1–1.0% of benzoyl peroxide (BPD) or other catalyst, in styrene, over a period of one-half hour to 2 hours, cooling to 100° C., and adding a solution containing 1–3% of divinyl benzene (DVB) (based on final graft polymer solids), alone or with some solvent and optional additional catalyst. The graft polymer will contain typically 40% styrene, 2% divinyl benzene (DVB) and 58% polybutadiene.

Most of the unreacted styrene, and some of the inert solvent (toluene) may be stripped off by vacuum distillation or nitrogen blowing if desired. Prepregs are then made by adding dicumyl peroxide (Dicup) catalyst, impregnating paper or glasscloth, and oven drying, e.g. 4 minutes at 250° F. to remove toluene, but not sufficient to cure the graft polymer.

The reinforcing elements employed in preparing prepregs, or B-stage reinforced laminate components may be of any of the usually conventionally employed reinforcing elements, for example, paper, glass fibers, cotton cloth, asbestos polyolefin fibers, nylon, Dacron, acrylonitrile fibers, etc., either in the form of parallel fibers or woven fibers, but preferably in the form of loosely woven fabrics. The final impregnated reinforced laminate copolyners, prior to effecting bonding with the polyolefin-rubber laminate copolymer, are formed in the prepregs or B-stage cured materials which are not tacky and which are essentially solid and dry to the touch, so that they may be readily stored and handled for ultimate use in manufacturing the final laminates.

The polyolefins, such as polyethylene, polypropylene, the copolymers of ethylene with propylene, the copolymers of ethylene with a butene, polybutene, polyheptene and the like may be prepared by any suitable method. One suitable method for preparing such polymers involves utilization of catalysts of the alkyl metal type. These catalysts used in this polymerization reaction are solid, insoluble reaction products obtained by reducing a reducible heavy transition metal compound, the metal component of which is taken from groups IVB, VIB, or VIII or manganese with a reducing organo-metallic compound of an alkali, alkaline earth, rare earth, or zinc metal compound. The catalyst can also be prepared by reducing an appropriate metal compound with either metallic aluminum, or a mixture of aluminum and titanium, or the like. The preferred catalyst of this type is usually prepared by reducing one mole of a titanium tetrahalide, preferably tetrachloride, to the corresponding trivalent titanium halide with about 0.2 to 6 moles of either aluminum triethyl or aluminum triisobutyl or other aluminum alkyl compound of the formula RR'ALX wherein R, R', and X preferably are alkyl groups having from 2 to 8 carbon atoms, although X can be hydrogen or halogen, preferably chlorine. In addition to the catalyst, an inert hydrocarbon solvent, which is preferably a $C_3$ to $C_{18}$ paraffin, e.g. isopentane, n-heptane, and the like, may be used in the polymerization. The end product, e.g. polyethylene, generally has a molecular weight in the range of 12,000 to 500,000 or more. These polyolefins are discussed in detail in the Belgian Patent 533,362; Chemical and Engineering News, Apr. 8, 1957, pp. 12 to 16; and Petroleum Refiner, December 1956, pp. 191 through 196, the subject matter of which is incorporated herein by reference. This invention is also applicable to low-density polyolefin, made by polymerization at about 100 to 400° C., under high pressure, e.g. 500 to 3,000 atmospheres, and preferably with a controlled trace of oxygen as catalyst, having a molecular weight above 1,000, preferably 5,000 to 30,000, e.g. 20,000.

The following examples are illustrative of the characteristics of the present invention, but they are not intended to be limiting of the invention. All parts and percentages given in these examples are upon a weight basis.

EXAMPLE I 75 parts of a polyethylene having the following properties density=0.9450 g./cc.
melt index=4.0 g./10 min. at 190° C.
tensile strength=3900 p.s.i.
elongation=70%.

were blended with 25 parts of unvulcanized smoked sheet natural rubber on a conventional rubber mill at 260° F.

for a sufficient length of time to give a homogeneous mixture. This blend was then pressed into a film of 10 mil thickness and was used to bond the brown copper oxide coated side of a metallic copper foil.

The backing layer, i.e. panel, was prepared as follows: Cotton linters paper was pretreated with a water-soluble thermosetting phenolic resin prepared from phenol and formaldehyde and was dried to a resin content of 12 to 13%. This resin pretreated paper was then impregnated with a material prepared as follows: Butadiene was polymerized with the aid of sodium catalyst to give a polybutadiene oil having a viscosity of about 80 poises measured in a 50% solution in Varsol at 77° F. A solution of 30 parts of the polybutadiene oil in 35 parts of toluene was heated to 115° C. and then 35 parts of styrene containing 0.7 part of benzoyl peroxide as the catalyst was added gradually over a 15 minute period. After another 20 minutes this material was cooled slightly and 1.3 parts of divinyl benzene added thereto and reacted at a temperature of 90–100° C. for an additional 30 minutes, and then cooled to 40° C. or lower. After stripping out most of the unreacted styrene, the final solution contained about 57% of graft polymer in 43% solvent. This graft polymer contained about 40% styrene and about 2% divinyl benzene (DVB) grafted onto 58% of polybutadiene. The 57% solution in toluene had a viscosity of about 8–10 stokes. Five parts of dicumyl peroxide, per 100 parts of polymer solids, was dissolved in the graft polymer solution. The pretreated paper was impregnated with this solution to get a total resin content of about 55% and the impregnated paper was dried in an oven at 250° F. for about 4 minutes. This prepreg was then used as the third layer in preparing the laminated material. It was laid adjacent to and in contact with the side of the polyethylene-natural rubber film which was not contacting the oxide treated copper foil. Seven plies of this paper prepreg constituted the third layer. The interlayer of polyethylene-unvulcanized rubber and the copper foil, together with the 7-ply prepreg paper were laminated and cured for 30 minutes at 340° F. under a pressure of about 300 lbs. per square inch gauge. The resultant laminate was permitted to cool under this pressure. The copper clad laminate had a copper peel strength of 22–24 lbs. per inch, as measured by the standard method NEMA LP 1–10.12 with a Spring Force Indicator (Hunter Spring Co. of Lansdale, Pennsylvania).

A similar laminate, prepared as above-described, but in which the polyethylene did not contain any rubber blended into it, had a copper peel strength of only 7.75 to 8.0 lbs. per inch.

EXAMPLE II

A polyethylene having the following properties
density=0.9424 g./cc.
molecular weight=360,000.
melt index=0.001 g./10 min. at 190° C.
Vicat softening point=264.2° F.

was compounded with the amounts of natural rubber shown in Table I.

A film of this blend of polyethylene and the specified amount of natural rubber smoked sheet (unvulcanized) was formed into a film or sheet of 10 mil thickness and laminated with the same materials and in the same manner as disclosed in Example I. The peel strengths were determined as in Example I also.

TABLE I

| Run No. | A | B | C |
|---|---|---|---|
| Polyethylene (wt. percent) | 100 | 75 | 60 |
| Natural rubber (wt. percent), Smoked Sheet | 0 | 25 | 40 |
| Melt index of blend, g./10 min. at 190° C | 0 | 0 | 0 |
| Copper peel strength, lbs./in. of Brown oxide coated copper foil | 20 | 27 | 24.5 |

Comparative runs were carried out in which the same percentages of GRS and substantially cis 1,4 polybutadiene synthetic rubbers were used in place of the natural rubber. In each instance, the peel strengths were no better than the control (Run A supra) or they were appreciably lower than the control (Run A).

EXAMPLE III

Another polyethylene having a melt index of 8.18/10 min. @190° C. and a density of 0.95 g./cc. was blended in the amounts shown in the following Table II with unvulcanized natural rubber (smoked sheet) and as in the cases of Examples I and II was pressed and rolled into a sheet of 10 mil thickness which was laminated with the same materials and in the same manner as described in Example I. The test data on degree of adhesion were obtained in the same manner as described in Example I.

TABLE II

| Run | D | E | F | G |
|---|---|---|---|---|
| Polyethylene (wt. percent) | 100 | 90 | 75 | 60 |
| Natural rubber (wt. percent), Smoked Sheet | 0 | 10 | 25 | 40 |
| Melt index of blend at 190° C. (g./10 min.) | 8.18 | 6.91 | 3.47 | 1.46 |
| Copper peel strength, lbs./in. of Brown oxide coated copper foil | 9 | 10–13 | 18 | 19 |

The same type of comparative runs were also carried out using the same amounts of the same synthetic rubbers as mentioned in Example II with the peel strengths being determined once again to be, at the best, no better than the control run D and in most instances giving peel strengths considerably lower than that obtained in run D.

Having now thus fully described and illustrated the invention, what is desired to be secured by Letters Patent is:

1. A process which comprises bonding a compounded mixture of a poly mono olefin selected from the group consisting of polyethylene, polypropylene, copolymers of ethylene with propylene, copolymers of ethylene with a butene, polybutenes, and polyheptenes and unvulcanized natural rubber to a copper oxide surface of a copper foil by pressing the compounded mixture to the copper oxide surface under a superatmospheric pressure of at least 50 lbs. per square inch and an elevated temperature of at least 240° F.

2. A process as in claim 1 wherein the pressure is between about 50 and about 3000 lbs. per sq. inch gauge and the temperature is between about 240° and about 450° F.

3. A process as in claim 1 wherein the compounded mixture contains between about 3 and about 50% by weight of said rubber, the remainder being poly mono olefin of at least 2000 molecular weight.

4. A process as in claim 1 wherein the poly mono olefin is a polyethylene.

5. A process as in claim 1 wherein the poly mono olefin is a polypropylene.

6. A process as in claim 1 wherein the compounded mixture is in sheet form and the unbonded compounded mixture surface of the resultant laminate is bonded to a reinforcing element resinifiable mix impregnate, wherein said resinifiable mix is an admixture of a normally liquid polymer of 75 to 100 weight percent $C_4$—$C_6$ conjugated diolefin and 25 to 0 weight percent of an ethylenically unsaturated monomer, and an organic peroxide, by heating said impregnate to between about 250° and 350° F. for between about 2 hours and about 1 minute, respectively, to partially cure the mix to a B-stage, bonding the B-stage partially cured impregnate to the unbonded compounded rubber mixture sheet and completely curing the resultant laminated composition.

7. A process as in claim 23 wherein the resinifiable mix is a butadiene-styrene copolymer, styrene, divinyl benzene and dicumyl peroxide mixture.

8. A process as in claim 6 wherein the reinforcing element is selected from the group consisting of fiber glass and paper.

9. A process as in claim 6 wherein the poly mono olefin component of the compounded mixture in sheet form is a polyethylene having a density of at least 0.94 gram per cc.

10. A process as in claim 6 wherein the poly mono olefin component of the compounded mixture in sheet form is a polypropylene having a density of at least 0.88 gram per cc.

11. A process as in claim 1 wherein the rubber component is nautral rubber smoked sheet.

12. A process as in claim 1 wherein the compounded poly mono olefin-natural rubber blend in sheet form serves as an intermediate layer between the copper oxide coated copper foil and a layer of reinforcing element-prepreg graft polymer prepared by polymerizing in an organic solvent a normally liguid polymer of 75 to 100 weight percent $C_4$ to $C_6$ conjugated diolefin with 25 to 0 weight percent of an ethylenically unsaturated monomer, with a monovinyl-containing monomer in the presence of an organic peroxide catalyst followed by partially graft polymerizing the resultant polymer at a temperature of between about 250° and about 350° F. for between about 2 hours and about 1 minute, respectively, with further amounts of a divinyl-containing monomer, impregnating the reinforcing element with the solution, followed by heat drying of the impregnated reinforcing element to remove the solvent.

13. A process as in claim 12 wherein the reinforcing element is selected from the group consisting of paper and fiber glass, the polymer is polybutadiene, the first vinyl-containing monomer is styrene and the final vinyl-containing monomer is divinyl benzene.

14. A laminated article comprising a copper foil one side of which is surfaced with copper oxide and to which side is bonded a layer of a compounded mixture of a poly mono olefin selected from the group consisting of polyethylene, polypropylene, copolymers of ethylene with propylene, copolymers of ethylene with a butene, polybutenes, and polyheptenes and an unvulcanized natural rubber.

15. A laminated article as in claim 14 wherein the compounded mixture contains between about 3 and about 40% by weight of an unvulcanized natural rubber, the remainder being poly mono olefin of at least 2000 molecular weight.

16. A laminated article as in claim 15 wherein the poly mono olefin is polyethylene.

17. A laminated article as in claim 15 wherein the poly mono olefin is polypropylene.

18. A laminated article prepared in accordance with the process of claim 6 wherein the poly mono olefin-rubber serves as an interlayer between the copper oxide coated copper foil and the fully cured reinforced element-thermoset resin impregnate.

19. A process as in claim 6 wherein the resinifiable mix also contains a monovinyl-containing monomer and a divinyl-containing monomer.

20. A laminated article prepared in accordance with the process of claim 12 wherein the resinifiable mix contains a normally liquid butadene-styrene copolymer, styrene, divinyl benzene, and dicumyl peroxide.

21. In a process for bonding a poly mono olefin to copper by means of a cuprous oxide layer integral with the copper base, the improvement which comprises (a) blending about 3 to about 50% by weight of an unvulcanized natural rubber with a poly mono olefin of at least 1000 molecular weight to form a compounded mixture, and (b) pressing the compounded mixture to the copper oxide layer under a superatmospheric pressure of about 25 to 2500 lbs. per square inch, at a temperature between about 270° and about 400° F.

22. The process of claim 21 wherein the poly mono olefin is polyethylene.

23. In a process for the formation of laminates consisting essentially of impregnating a reinforcing element with a resinifiable mix containing a conjugated $C_4$—$C_6$ diolefin and bonding said resinifiable mix impregnated reinforcing element to a copper oxide surfaced copper foil, the improvement of which comprises inserting an interlayer between the copper oxide surfaced copper foil and the reinforcing element, the interlayer consisting of a compounded mixture of about 3 to about 50% by weight of an unvulcanized natural rubber and a poly mono olefin of at least 1000 molecular weight.

24. The process of claim 23 wherein the poly mono olefin is polyethylene.

References Cited

UNITED STATES PATENTS

| | | | |
|---|---|---|---|
| 2,551,591 | 5/1951 | Foord. | |
| 2,876,067 | 3/1959 | Nagel et al. | 260—4 |
| 2,884,161 | 4/1959 | Hurd et al. | 156—308 |
| 2,892,972 | 6/1959 | Ross | 156—334 |
| 3,024,813 | 5/1962 | Sear et al. | 156—334 |
| 3,079,295 | 2/1963 | Slotterbeck et al. | 156—334 |
| 3,240,662 | 3/1966 | Smyers et al. | 161—247 X |

FOREIGN PATENTS

| | | |
|---|---|---|
| 567,096 | 1/1945 | Great Britain. |

ALEXANDER WYMAN, *Primary Examiner.*

EARL M. BERGERT, *Examiner.*

W. B. WALKER, M. A. LITMAN, *Assistant Examiners.*